United States Patent
Miyata et al.

(10) Patent No.: US 10,365,317 B2
(45) Date of Patent: Jul. 30, 2019

(54) SEMICONDUCTOR ELEMENT TEST APPARATUS AND SEMICONDUCTOR ELEMENT TEST METHOD

(71) Applicant: DENSO CORPORATION, Kariya, Aichi-pref. (JP)

(72) Inventors: Masanori Miyata, Kariya (JP); Yoshifumi Okabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 52 days.

(21) Appl. No.: 15/735,356

(22) PCT Filed: Jun. 9, 2016

(86) PCT No.: PCT/JP2016/002793
§ 371 (c)(1),
(2) Date: Dec. 11, 2017

(87) PCT Pub. No.: WO2016/208141
PCT Pub. Date: Dec. 29, 2016

(65) Prior Publication Data
US 2018/0172752 A1    Jun. 21, 2018

(30) Foreign Application Priority Data
Jun. 25, 2015 (JP) .................. 2015-127990

(51) Int. Cl.
*G01R 31/26* (2014.01)
*G01R 31/28* (2006.01)

(52) U.S. Cl.
CPC ..... *G01R 31/2601* (2013.01); *G01R 31/2633* (2013.01); *G01R 31/2886* (2013.01)

(58) Field of Classification Search
CPC ............ G01R 31/2601; G01R 31/2633; G01R 31/2886
USPC ......... 324/750.01, 762.07; 361/191; 318/371
See application file for complete search history.

(56) References Cited

U.S. PATENT DOCUMENTS

2017/0131344 A1    5/2017  Miyata et al.

FOREIGN PATENT DOCUMENTS

| JP | 10197594 | * 10/1997 | ............. G01R 31/26 |
| JP | H10-197594 A | 7/1998 | |
| JP | 2005-345247 A | 12/2005 | |
| JP | 2007-033042 A | 2/2007 | |

(Continued)

*Primary Examiner* — Farhana A Hoque
(74) *Attorney, Agent, or Firm* — Posz Law Group, PLC

(57) ABSTRACT

A semiconductor element test apparatus includes a first switch having a switching element, a coil, a second switch, a semiconductor element, a first rectifying element, and a second rectifying element. The first switch, the coil, and the second switch are connected in series to a power source. The semiconductor element is disposed to configure a loop path along with the coil and the second switch when the switching element is switched off. The semiconductor element has a diode element. A cathode electrode of the diode element is connected to a positive electrode of the power source. The second rectifying element is connected to the first rectifying element in series, and has a rectification direction opposite to a rectification direction of the first rectifying element. The first rectifying element and the second rectifying element configure, along with the coil, another loop path which is different from the loop path.

14 Claims, 4 Drawing Sheets

(56) References Cited

FOREIGN PATENT DOCUMENTS

| JP | 2008-164364 A | 7/2008 |
| JP | 2010-276477 A | 12/2010 |
| JP | 2013-108802 A | 6/2013 |

\* cited by examiner

SEMICONDUCTOR ELEMENT TEST APPARATUS AND SEMICONDUCTOR ELEMENT TEST METHOD

CROSS REFERENCE TO RELATED APPLICATIONS

This application is a U.S. national stage of International Patent Application No. PCT/JP2016/002793 filed on Jun. 9, 2016 and is based on Japanese Patent Application No. 2015-127990 filed on Jun. 25, 2015, the disclosure of which is incorporated herein by reference.

TECHNICAL FIELD

The present disclosure relates to a semiconductor element test apparatus and a semiconductor element test method each of which tests a semiconductor element having a diode element.

BACKGROUND ART

Conventionally, as a kind of test apparatus, for example, a test circuit is proposed in Patent Literature 1. In the test circuit, a switch, a coil, and a semiconductor element are connected in series to a power source. In this configuration, a diode element is disposed to configure a loop path along with the coil. In this case, the loop path is configured when the switch and a switching element configuring the semiconductor element are switched off. A cathode electrode of the diode element is connected to a positive electrode of the power source.

PRIOR ART LITERATURE

Patent Literature

Patent Literature 1: JP 2008-164364 A

SUMMARY OF INVENTION

In a test circuit disclosed in Patent Literature 1, a semiconductor element or a diode element corresponds to a test object (DUT: Device Under Test). Suppose that the diode element functions as the DUT and a switch is switched on and off repeatedly in order to test a recovery characteristic or the like of the DUT. In this case, a flyback current flows through a loop path including a coil and the DUT when the switch is switched off. Thereafter when the switch is switched on, a recovery current flows through the DUT, and then when the switch is switched off, the flyback current flows through the DUT again.

A period of the flyback current flowing after the recovery is longer than a period of the flyback current flowing before the recovery. In this configuration, in a DUT, heat generated by the flyback current flowing after the recovery is greater than heat generated by the flyback current flowing before the recovery. Thus, the flyback current flowing after the recovery may damage or break down the DUT.

When the DUT is broken down, the current concentrates on a breakdown part. In this case, a large current flows through a test instrument, such as a probe and a stage, which is disposed to contact an electrode of the DUT. Thus, when the DUT is broken down by the flyback current flowing after the recovery, the damage of the test instrument is promoted.

Suppose that the DUT is broken down during the recovery operation. In this case, the damage of the test instrument is also promoted by the flyback current flowing after the recovery.

In view of the foregoing difficulties, it is an object of the present disclosure to provide a semiconductor element test apparatus and a semiconductor element test method, both of which are capable of decreasing a damage of a test instrument when a DUT includes a diode element.

According to an aspect of the present disclosure, a semiconductor element test apparatus includes a first switch having a switching element, a coil, a second switch, a semiconductor element, a first rectifying element, and a second rectifying element. The first switch, the coil, and the second switch are connected in series to a power source. The semiconductor element is provided as a test object. The semiconductor element is disposed to configure a loop path along with the coil and the second switch when the switching element of the first switch is switched off. The semiconductor element has a diode element. A cathode electrode of the diode element is connected to a positive electrode of the power source. The second rectifying element is connected to the first rectifying element in series. The second rectifying element has a rectification direction opposite to a rectification direction of the first rectifying element. The first rectifying element and the second rectifying element configure, along with the coil, another loop path which is different from the loop path including the semiconductor element.

In the above-described test apparatus, the coil, the first rectifier element, and the second rectifier element are disposed to configure another loop path, which is different from the loop path including the semiconductor element. With this configuration, the flyback current flowing through the semiconductor element can be restricted, and the damage of the test instrument can be reduced.

According to another aspect of the present disclosure, a semiconductor element test method for a semiconductor element, in which the semiconductor element has a diode element that is provided as a test object. The semiconductor element test method includes connecting a first switch, a coil, and a second switch in series to a power source, in which the first switch has a switching element; disposing the semiconductor element to configure a loop path along with the coil and the second switch when the switching element of the first switch is switched off; connecting a cathode electrode of the diode element to a positive electrode of the power source; disposing a first rectifying element and a second rectifying element to configure, along with the coil, another loop path which is different from the loop path including the semiconductor element, in which the second rectifying element is connected to the first rectifying element in series, and the second rectifying element has a rectification direction opposite to a rectification direction of the first rectifying element; and performing a test of the semiconductor element by switching on and switching off the switching element repeatedly.

In the above-described test method, the coil, the first rectifier element, and the second rectifier element are disposed to configure another loop path, which is different from the loop path including the semiconductor element. With this configuration, the flyback current flowing through the semiconductor element can be restricted, and the damage of the test instrument can be reduced.

BRIEF DESCRIPTION OF DRAWINGS

The above and other objects, features and advantages of the present invention will become more apparent from the following detailed description made with reference to the accompanying drawings. In the drawings.

EMBODIMENTS FOR CARRYING OUT INVENTION

Hereinafter, embodiments of the present disclosure will be described with reference to the drawings. In each embodiment, same or equivalent items are denoted by the same reference symbols, respectively.

First Embodiment

Figure 1:
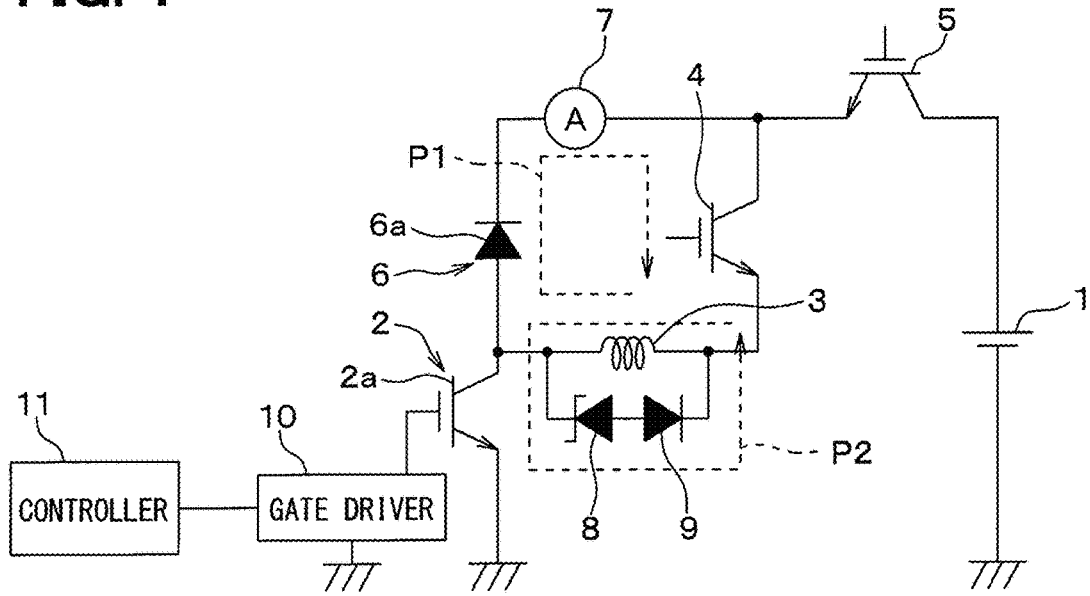
FIG. 1 is a diagram showing a configuration of a test apparatus according to a first embodiment of the present disclosure.

A first embodiment of the present disclosure will be described. A semiconductor element test apparatus according to the present embodiment performs a recovery test of a semiconductor element by employing a power source 1. As shown in FIG. 1, the test apparatus of the present embodiment includes the power source 1, a first switch 2, a coil 3, a second switch 4, a protection switch 5, a DUT 6, an ammeter 7, a first rectifying element 8, a second rectifying element 9, a gate driver 10, and a controller 11.

As shown in FIG. 1, the protection switch 5, the second switch 4, the coil 3, and the first switch 2 are connected in series to the power source 1. The first switch 2 switches a path of current that flows through the coil 3. In the present embodiment, the first switch 2 has a switching element 2a. The switching element 2a is provided by an N channel IGBT (Insulated Gate Bipolar Transistor) element having a gate electrode, a collector electrode, and an emitter electrode.

As shown in FIG. 1, the gate electrode of the switching element 2a is connected to the gate driver 10, and the gate driver 10 is connected to the controller 11. The gate driver 10 switches on and off the first switch 2 by changing a gate voltage of the switching element 2a in response to a signal input from the controller 11. The gate driver 10 is connected to a negative electrode (ground) of the power source 1. The controller 11 repeatedly switches on and off the switching element 2a through the gate driver 10.

The coil 3 is employed as an inductance component of an inductive load. When the first switch 2 is switched off during on state of the second switch 4, the coil 3 generates a flyback current which flows through the DUT 6. The second switch 4 connects the path of the current flowing through the coil 3 during off state of the first switch 2. In the present embodiment, the second switch 4 is provided by the N channel IGBT element having the gate electrode, the collector electrode, and the emitter electrode.

The gate electrode of the second switch 4 is connected to a gate driver that is not shown in FIG. 1. The gate driver is connected to the controller 11. The controller 11 switches on and off the second switch 4 through the gate driver corresponding to different situations.

The protection switch 5 interrupts the current supplied from the power source 1 to the second switch 4 or the like in order to restrict damage of a test instrument when the DUT 6 is broken down. The protection switch 5 is provided by the N channel IGBT element having the gate electrode, the collector electrode, and the emitter electrode.

The gate electrode of the protection switch 5 is connected to a gate driver that is not shown in FIG. 1. The gate driver is connected to the controller 11. When the controller 11 determines that the DUT 6 is broken down, the controller 11 switches off the protection switch 5 through the gate driver.

As shown in FIG. 1, the positive electrode of the power source 1 is connected to the collector electrode of the protection switch 5. The emitter electrode of the protection switch 5 is connected to the collector electrode of the second switch 4. The emitter electrode of the second switch 4 is connected to one end of the coil 3. Another end of the coil 3 is connected to the collector electrode of the switching element 2a included in the first switch 2. The emitter electrode of the switching element 2a is connected to the ground.

As shown in FIG. 1, when the first switch 2 is switched off, the DUT 6 and the ammeter 7 are disposed to configure a loop path P1 along with the coil 3 and the second switch 4. In the loop path P1, the DUT 6 is connected to the ammeter 7 in series.

The DUT 6 functions as the test object in the present embodiment, and corresponds to the semiconductor element in the present disclosure. The DUT 6 has a diode element 6a. The diode element 6a is provided by a vertical FWD (free wheel diode) element.

One electrode of the diode element 6a contacts a probe that is not shown in FIG. 1. Another electrode of the diode element 6a contacts wiring located on a stage that is not shown in FIG. 1.

The ammeter 7 measures the current flowing through the DUT 6 in order to detect a breakdown of the DUT 6. A method of detecting the breakdown may employ a method described in Patent Literature 1. The ammeter 7 is connected to the controller 11 via wiring that is not shown in FIG. 1. The controller 11 determines whether the DUT 6 is broken down by detecting an overcurrent based on output of the ammeter 7.

With the above-described configuration, the ammeter 7 measures the current flowing through the DUT 6, and the controller 11 detects the breakdown of the DUT 6 based on the output of the ammeter 7. Thus, the ammeter 7 and the controller 11 correspond to a breakdown detector in the present enclosure.

As shown in FIG. 1, the cathode electrode of the diode element 6a that the DUT 6 has is connected to the positive electrode of the power source 1 via the ammeter 7 and the protection switch 5. The anode electrode of the diode element 6a is connected to a wiring located between the first switch 2 and the coil 3.

As shown in FIG. 1, the first rectifying element 8 and the second rectifying element 9 configure a loop path P2, which is different from the loop path P1 including the DUT 6 and the coil 3. In the loop path P2, the second rectifying element 9 is connected to the first rectifying element 8 in series, and the second rectifying element 9 rectifies the current in a direction opposite to a rectification direction of the first rectifying element 8.

During on state of the second switch 4, the first rectifying element 8 prevents the current flowing through the coil 3 from entering the loop path P2. In the present embodiment, the first rectifying element 8 is provided by a Zener diode element. The first rectifying element 8 is connected to rectify a current having a direction opposite to the current generated by a counter electromotive force of the coil 3. Herein, the counter electromotive force of the coil 3 is generated when the second switch 4 is switched off.

The second rectifying element 9 prevents the current flowing through the second switch 4 from being supplied to the first switch 2 through the first rectifying element 8. That is, the second rectifying element 9 prevents the current bypassing the coil 3 from being supplied to the first switch 2. The second rectifying element 9 is provided by a FWD element.

The controller 11 properly controls each switch corresponding to various situations. The controller 11 is provided by a publicly known microcomputer including a CPU, a ROM, a RAM, and an I/O. The controller 11 executes processing of various kinds of operations according to a program stored in the ROM or the like, and performs the recovery test.

The controller 11 switches on the first switch 2 and switches off the first switch 2 alternatively twice. The controller 11 switches on the second switch 4 at a time point after the first time switch-on of the first switch 2 and before the second time switch-on of the first switch 2. The controller 11 switches off the second switch 4 at a time point after the second time switch-on of the first switch 2 and before the second time switch-off of the first switch 2.

The controller 11 switches on the protection switch 5 before switching off the first switch 2 for the first time. When detecting the breakdown of the DUT 6 based on the output of the ammeter 7, the controller 11 switches off the second switch 4, and then switches off the first switch 2 and the protection switch 5.

The semiconductor element test apparatus according to the present embodiment is described above. Hereinafter, a semiconductor element test method employing the test apparatus will be described with comparison of a conventional test apparatus.

The controller 11 inputs a driving signal to the gate electrode of the switching element 2a through the gate driver 10. The driving signal has a pulse shape, and the pulse shape has a predetermined amplitude and a predetermined frequency. The controller 11 repeatedly switches on and off the switching element 2a alternatively so that the current flowing through the DUT 6 and the voltage applied to the DUT 6 are changed. With this operation, a characteristic test of the DUT 6 is performed.

Figure 2:
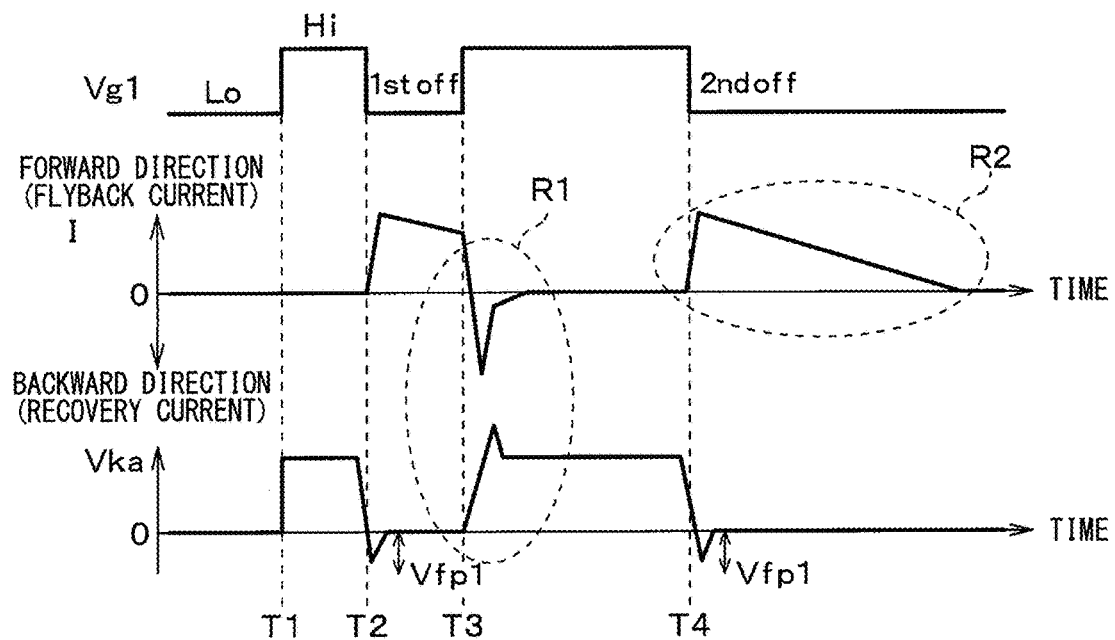
FIG. 2 is a time chart showing a relation between a condition of a first switch and current flowing through a DUT of a conventional test apparatus.
Figure 3:
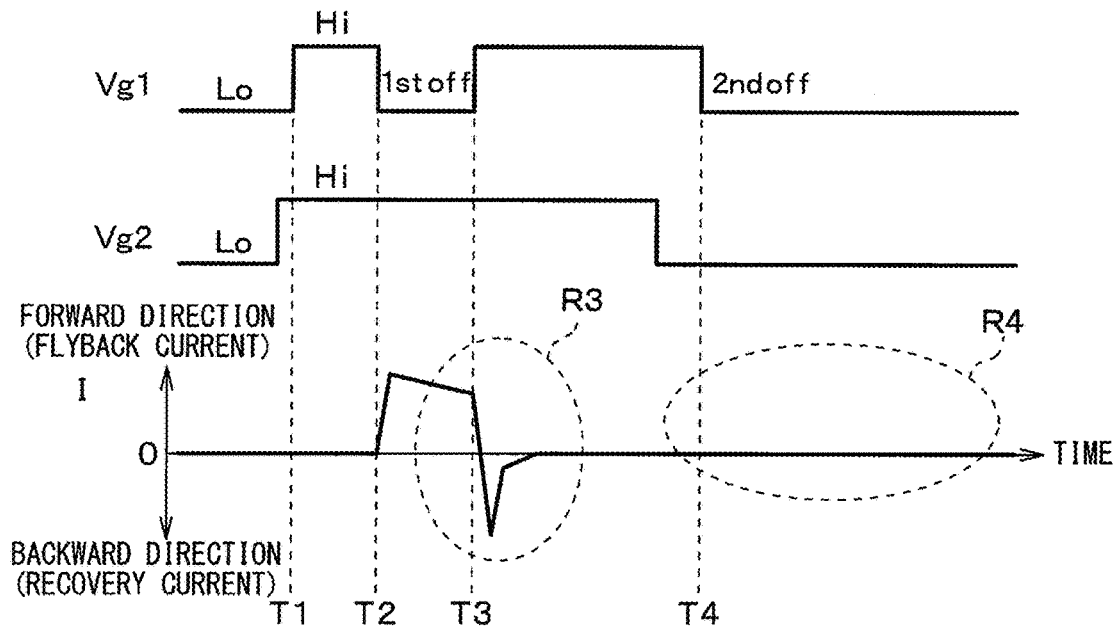
FIG. 3 is a time chart showing a relation between a condition of a first switch and current flowing through a DUT of the test apparatus shown in FIG. 1.

As shown in FIG. 2 and FIG. 3, for example, the controller 11 switches on the switching element 2a at a time T1, and switches off the switching element 2a at a time T2. Thereafter, the controller 11 switches on the switching element 2a at a time T3, and switches off the switching element 2a at a time T4.

Figure 5:
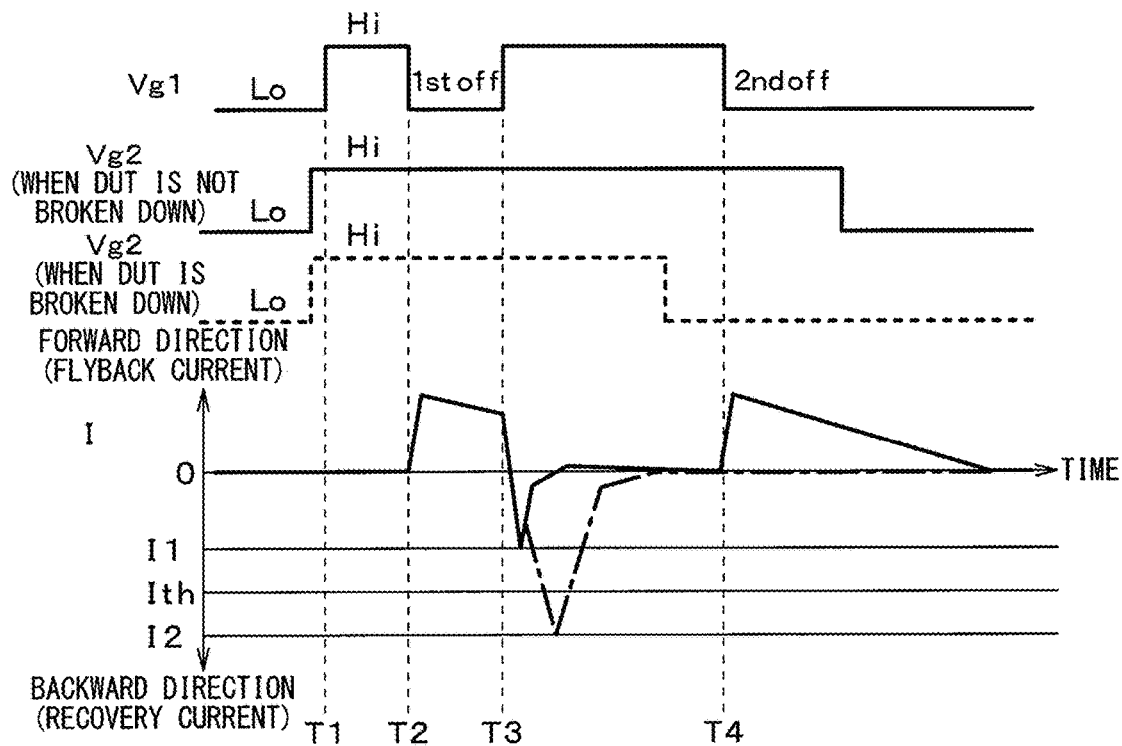
FIG. 5 is a time chart showing a relation between a condition of a second switch and the current flowing through the DUT according to a second modification of the first embodiment.

In FIG. 2, FIG. 3, and FIG. 5 that will be described later, Vg1 and Vg2 represent gate signals applied to the switching element 2a and the second switch 4, respectively. Herein, each of the gate signals Vg1 and Vg2 has a high level or a low level. In FIG. 2, Vka represents a voltage applied to both end of the diode element 6a.

When the switching element 2a is switched off at the time T2, a current I (a forward current) flowing through the DUT 6 gradually increases and the flyback current flows through the loop path P1. When the switching element 2a is switched on at the time T3, as shown in areas R1 and R3, the current I flowing through the DUT 6 gradually decreases, and a recovery current (a backward current) is generated.

In the conventional test apparatus, after recovery of the DUT 6 is finished, the switching element 2a is switched off at the time T4 and then the flyback current flows through the DUT 6 included in the loop path P1 as shown in an area R2 in FIG. 2. Herein the conventional test apparatus does not include the second switch 4, the first rectifying element 8, and the second rectifying element 9.

A period of the flyback current flowing after the recovery is longer than a period of the flyback current flowing before the recovery. In this configuration, in the DUT 6, heat generated by the flyback current flowing after the recovery is greater than heat generated by the flyback current flowing before the recovery. Thus, the flyback current flowing after the recovery may damage or break down the DUT 6.

When the DUT 6 is broken down, the current concentrates on a breakdown part. In this case, a large current flows through a test instrument, such as the probe and the stage, which is disposed to contact an electrode of the DUT 6. Thus, when the DUT 6 is broken down by the flyback current flowing after the recovery, damage of the test instrument is promoted.

Suppose that the DUT 6 is broken down during the recovery operation. In this case, the damage of test instrument is also promoted by the flyback current flowing after the recovery. Thus, the conventional test apparatus, which has been described as a comparison example, increases a cost of the test and makes it difficult to perform a breakdown analysis of the test object element.

In the present embodiment, the first rectifying element 8 and the second rectifying element 9 are disposed to configure the loop path P2 along with the coil 3. The second switch 4 is disposed to configure the loop path P1 along with the coil 3, the DUT 6, and the ammeter 7. As shown in FIG. 3, the controller 11 controls the second switch 4.

The controller 11 switches on the second switch 4 before the time point T1, and switches off the second switch 4 at a time point after the time T3 and before the time T4. After the recovery operation of the DUT 6 is finished, the controller 11 switches off the second switch 4 before the time point T4 when the flyback current is generated. In this configuration, when the switching element 2a is switched off at the time T4, the flyback current flows through the loop path P2 bypassing the loop path P1. Thus, as shown in an area R4 in FIG. 3, the flyback current flowing through the DUT 6 is not generated. When detecting the breakdown of the DUT 6 based on the signal transmitted from the ammeter 7, the controller 11 switches off the protection switch 5 in order to protect the power source 1.

With the above-described configuration, in the present embodiment, the flyback current after the recovery does not flow through the DUT 6. Thus, the damage or the breakdown of the DUT 6 can be restricted, and the damage of the test instrument, such as the probe and the stage, can be reduced. Suppose that the DUT 6 is broken down in the recovery operation. Even in this case, the damage of the test object element and the damage of the test instrument by the flyback current can be reduced.

In order to control the path of the flyback current described above, a reverse breakdown voltage Vz of the first rectifying element 8 needs to be set properly. When the reverse breakdown voltage Vz is excessively low, the flyback current, which makes the DUP 6 perform the recovery operation, is distributed to the loop path P1 and the loop path P2. In this configuration, the recovery test cannot be normally performed.

A maximum value of a forward voltage of the diode element 6a during generation of the flyback current is defined as Vfp1. As shown in FIG. 2, the maximum value Vfp1 is provided by a peak value of the voltage Vka that increases in a forward direction by carrier accumulation delay after the first switch 2 is switched off and the flyback current is generated.

A switch-on voltage of the second switch 4 is defined as Von. When the second switch 4 is not in off state, a maximum reverse bias voltage applied to the first rectifying element 8 is defined as Vmax1. The voltages Vmax1, Vfp1, and Von satisfy the following equation Vmax1=Vfp1+Von. The equation is established on a reverse bias when the flyback current starts flowing. In order to make the flyback current flow through the loop path P2 only during off state of the second switch 4, the voltages Vmax1, Vfp1, and Von satisfy the following relation Vz>Vfp1+Von.

When the reverse breakdown voltage Vz is excessively high, the flyback current is hard to flow through the loop path P2. Thus, the loop path P2 fails to function as a flyback path. When the second switch 4 is switched off, a maximum reverse bias voltage Vmax2 applied to the first rectifying element 8 is defined by a voltage the second switch 4 is capable of maintaining and a power source voltage Vcc. The voltage that the second switch 4 is capable of maintaining is an avalanche breakdown tolerance Vbr. The voltages Vmax2, Vbr, and Vcc satisfy the following equation Vmax2=Vbr−Vcc. The relation Vz<Vbr−Vcc needs to be satisfied for the loop path P2 functioning as the flyback path.

As described above, in the present embodiment, the coil 3, the first rectifying element 8, and the second rectifying element 9 are disposed to configure the loop path P2, which is different from the loop path P1 including the DUT 6. With this configuration, the flyback current flowing through the DUT 6 can be restricted, and the damage of the DUT 6 can be reduced. Thus, the damage of the test instrument can be reduced. When the DUT 6 is broken down in the recovery operation, the damage of the test object element and the damage of the test instrument by the flyback current can be reduced.

Figure 4:
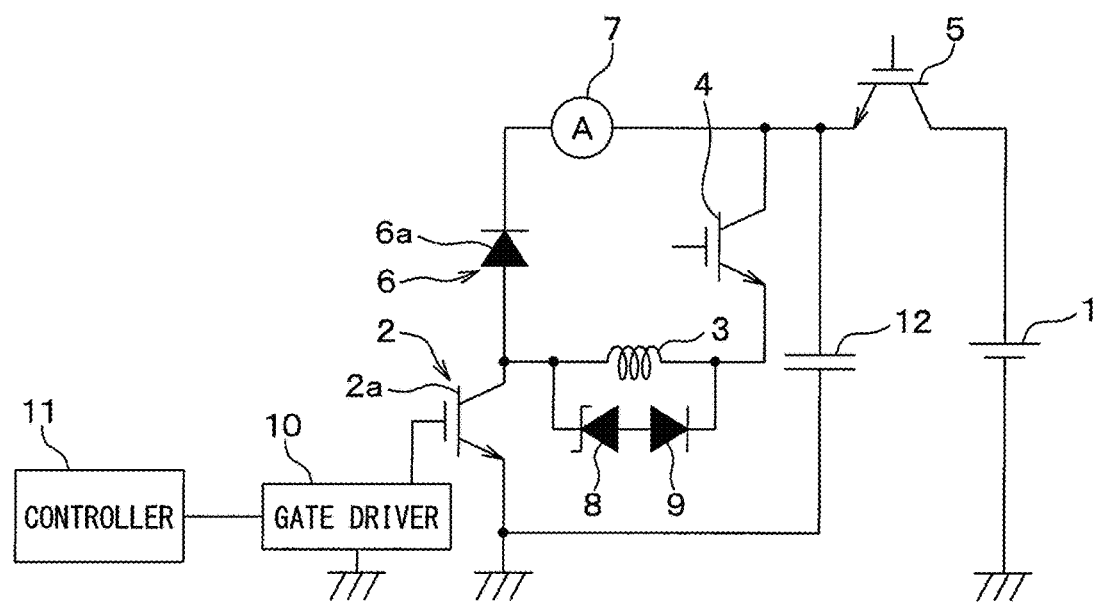
FIG. 4 is a diagram showing a first modification of the first embodiment.

As shown in FIG. 4, a smoothing capacitor 12 may be disposed between the ground and a connection point that is located between the protection switch 5 and the ammeter 7. The smoothing capacitor 12 can reduce a parasitic inductance, and can supply the constant power source voltage by reducing a ripple generated by the switching operation and restricting influence of noise. With this configuration, the damage and the breakdown of the DUT 6 can be further restricted and the damage of the test instrument can be further reduced.

In the above embodiment, the second switch 4 is configured to switch off at a time point after the time T3 and before the time T4 regardless of the breakdown of the DUT 6. Alternatively, the second switch 4 may be configured to switch off at a time point after the time T3 and before the time T4 only when the breakdown of the DUT 6 is detected based on the output of the ammeter 7.

In the above-described case, the controller 11 detects the breakdown of the DUT 6 by setting a predetermined value of the backward current flowing through the DUT 6 as a threshold value. The threshold value is set to be a higher value than a peak value of the backward current in case that the DUT 6 is operating properly without breakdown.

As shown FIG. 5, a threshold value Ith of the current to detect the breakdown of the DUT 6 is set between a peak value I1 of the recovery current and a peak value I2 of the recovery current. Herein, the peak value I1 is a value in case that the DUT 6 is operating properly without breakdown, and the peak value I2 is a value in case that the DUT is broken down. When the current I flowing through the DUT 6 is higher than the threshold value Ith in the backward direction, the controller 11 determines that the DUT 6 is broken down.

As shown in FIG. 5, when the controller 11 does not detect the breakdown of the DUT 6, the second switch 4 is kept in on state from a time point before the time T1 to a time point after the time T4. With this configuration, the flyback current generated after the time T4 flows through the loop path P1 including the DUT 6. As shown by a dotted line in FIG. 5, when the DUT 6 is broken down by the recovery current, the second switch 4 is switched off at a time point after the time T3 and before the time T4. With this configuration, as shown by a dashed-dotted line in FIG. 5, the flyback current does not flow through the DUT 6.

When the breakdown of the DUT 6 is detected by the ammeter 7, the controller 11 switches off the first switch 2 and the protection switch 5. Suppose that the protection switch 5 is switched off before the second switch 4 is switched off. In this case, the flyback current flows through the loop path P1 after the protection switch 5 is switched off. Thus, the damage of the test instrument is promoted. In this modification, after the breakdown of the DUT 6 is detected, the second switch 4 is switched off before the first switch 2 and the protection switch 5 are switched off. This configuration can prevent the flyback current from flowing through the loop path P1, and the damage of the test instrument can be reduced.

With the above-described configuration, only when the breakdown of the DUT 6 is detected, the second switch 4 is switched off at a time point after the time T3 and before the time T4, and the path of the flyback current is switched. Thus, an operation of the DUT 6 through which the flyback current flows after the time T4 can be tested.

Second Embodiment

Hereinafter, a second embodiment of the present disclosure will be described. In the present embodiment, a protect element 13 is added to the first embodiment. Other parts are same as the parts of the first embodiment. Thus, only a part of a configuration that is different from the configuration of the first embodiment will be described.

Figure 6:
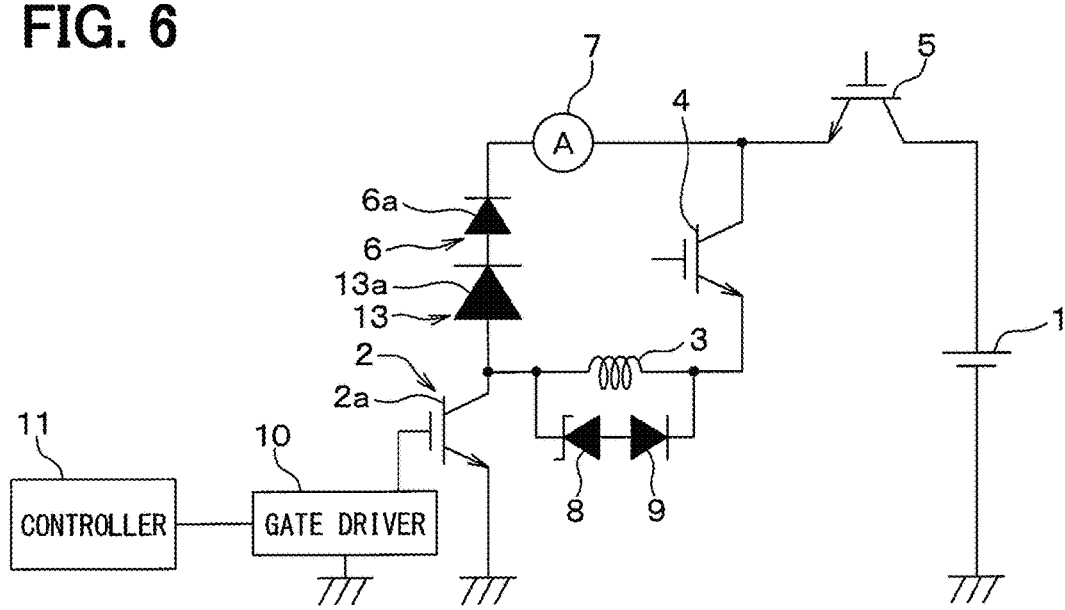
FIG. 6 is a diagram showing a configuration of the test apparatus according to a second embodiment of the present disclosure.

As shown in FIG. 6, in the present embodiment, the protect element 13 is disposed to configure a loop path along with the coil 3, the second switch 4, the DUT 6, and the ammeter 7 when the first switch 2 is switched off. The protect element 13 has a protect diode element 13a having larger breakdown strength than the DUT 6.

The protect diode element 13a is provided by the FWD element, and disposed to have the same rectification direction as the diode element 6a. A cathode electrode of the protect diode element 13a is connected to the anode electrode of the diode element 6a. An anode electrode of the protect diode element 13a is connected to the collector electrode of the switching element 2a. One end of the coil 3 is connected to a wiring located between the protect diode element 13a and the switching element 2a.

In the present embodiment, in order to control the flyback current to flow through the loop path P2 only when the second switch 4 is switched off, the voltages Vz, Vfp1, Vfp2, and Von satisfy the following relation Vz>Vfp1+Vfp2+Von. Herein, Vfp2 represents a maximum value of a forward voltage of the protect diode element 13a in case that the flyback current is generated.

The configuration of the test apparatus of the present embodiment, which adds the protect element 13, can provide advantages similar to the advantages provided by the first embodiment.

In the configuration of the present embodiment, even though the recovery current breaks down the DUT 6, the protect diode element 13a can prevent an absolute value of a short-circuit current flowing through the DUT 6 from increasing steeply. The protect diode element 13a can prevent a large current from flowing through the DUT 6. Thus, the damage of the test instrument, such as the probe and the stage, can be further reduced.

In the present embodiment, the protect element 13 is disposed on the above-described position, but a position of the DUT 6 may be exchanged with a position of the protect element 13. The cathode electrode of the protect diode element 13a may be connected to the ammeter 7. The anode electrode of the protect diode element 13a may be connected to the cathode electrode of the diode element 6a. The anode electrode of the diode element 6a may be connected to the collector electrode of the switching element 2a.

Third Embodiment

A third embodiment of the present disclosure will be described. In the present embodiment, an upper arm drive (that is, a high side drive) replaces a lower arm drive (that is, a low side drive) provided by the protect element 13 in the second embodiment. Other parts are same as the parts of the second embodiment. Thus, only a part of a configuration that is different from the configuration of the second embodiment will be described.

Figure 7:
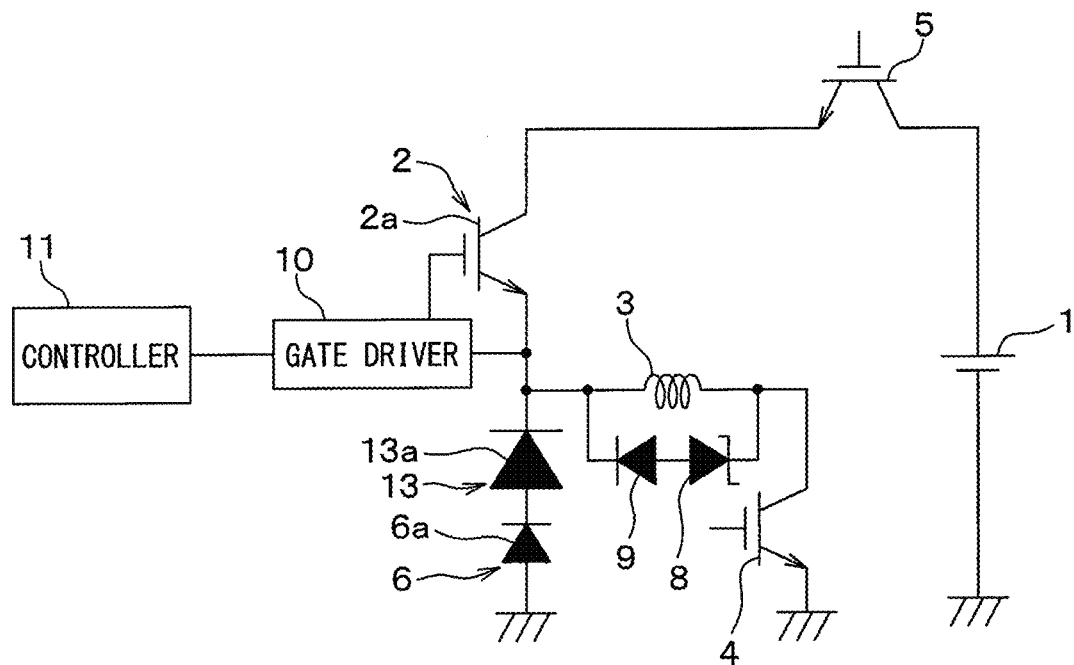
FIG. 7 is a diagram showing a configuration of the test apparatus according to a third embodiment of the present disclosure.

In the present embodiment, positions of elements configuring the loop path P1 are exchanged with a position of the first switch 2. As shown in FIG. 7, the emitter electrode of the protection switch 5 is connected to the collector electrode of the switching element 2a, and the emitter electrode of the switching element 2a is connected to the cathode electrode of the protect diode element 13a. Voltage of the emitter electrode of the switching element 2a is input to the gate driver 10.

The anode electrode of the protect diode element 13a is connected to the cathode electrode of the diode element 6a, and the anode electrode of the diode element 6a is connected to the ground. One end of the coil 3 is connected to a wiring located between the switching element 2a and the protect diode element 13a. Another end of the coil 3 is connected to the collector electrode of the second switch 4. The emitter electrode of the second switch 4 is connected to the ground.

The first rectifying element 8 and the second rectifying element 9 configure a different loop path along with the coil 3, and this loop path is different from a loop path including the DUT 6. The different loop path is configured by the coil 3, the first rectifying element 8, and the second rectifying element 9. In the different loop path, the second rectifying element 9 is connected to the first rectifying element 8 in series, and the second rectifying element 9 has a rectification direction opposite to the rectification direction of the first rectifying element 8.

The cathode electrode of the first rectifying element 8 is connected to the wiring located between the coil 3 and the second switch 4. The anode electrode of the first rectifying element 8 is connected to the anode electrode of the second rectifying element 9. The cathode electrode of the second rectifying element 9 is connected to a wiring located among the coil 3, the switching element 2a, and the protect diode element 13a.

In FIG. 7, although the ammeter 7 is not shown, the ammeter 7 is disposed between the diode element 6a and the ground.

As above-described configuration, the test apparatus in the present embodiment in which positions of the elements configuring the loop path P1 are exchanged with a position of the first switch 2 can provide advantages similar to the advantages provided by the second embodiment.

Fourth Embodiment

A fourth embodiment of the present disclosure will be described. In the present embodiment, upper and lower arm drives replace the upper arm drive applied in the third embodiment. Other parts are same as the parts of the third embodiment. Thus, only a part of a configuration that is different from the configuration of the third embodiment will be described.

Figure 8:
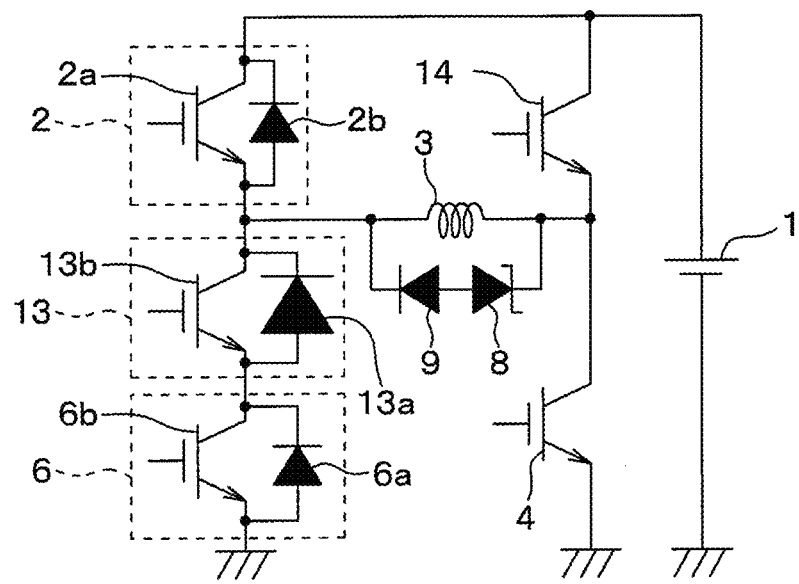
FIG. 8 is a diagram showing a configuration of the test apparatus according to a fourth embodiment of the present disclosure.

As shown in FIG. 8, in the present embodiment, the DUT 6 is configured by the diode element 6a and a switching element 6b that is connected to the diode element 6a in parallel. The first switch 2 is configured by a diode element 2b and the switching element 2a that is connected to the diode element 2b in parallel. The protect element 13 is configured by the protect diode element 13a and a switching element 13b that is connected to the protect diode element 13a in parallel.

Each of the switching elements 2a, 6b, and 13b in the present embodiment is provided by the IGBT element. Each of the diode elements 2b, 6a, and 13a is in the present embodiment is provided by the FWD element. Cathode electrodes of the diode elements 2b, 6a, and 13a are connected to collector electrodes of the switching elements 2a, 6b, and 13b, respectively. Anode electrodes of the diode elements 2b, 6a, and 13a are connected to emitter electrodes of the switching elements 2a, 6b, and 13b, respectively.

In FIG. 8, the ammeter 7, the gate driver 10, and the controller 11 are not shown. The ammeter 7 is disposed between the DUT 6 and the ground. The test apparatus of the present embodiment does not include the protection switch 5. The positive electrode of the power source 1 is connected to the collector electrode of the switching element 2a.

As shown in FIG. 8, a third switch 14 is disposed between a connection point connecting the power source 1 and the switching element 2a, and a connection point connecting the coil 3 and the second switch 4. In the present embodiment, the third switch 14 is provided by the IGBT element. A collector electrode of the third switch 14 is connected to a wiring located between the power source 1 and the switching element 2a. An emitter electrode of the third switch 14 is connected to a wiring located between the coil 3 and the second switch 4.

The switching element 6b and 13b and a gate electrode of the third switch 14 are connected to a gate driver that is not shown in FIG. 8. The gate driver is connected to the controller 11. The controller 11 controls the switching elements 6b and 13b, and the third switch 14 via the gate driver.

The above-described test apparatus controls the switching elements 2a, 6b, and 13b, the second switch 4, and the third switch 14 to be switched on and off. With this configuration, the test apparatus performs the characteristic test of the DUT 6 by changing the direction of the current flowing through the coil 3 and changing the current flowing through the DUT 6 and the voltage applied to the DUT 6.

Suppose that the test apparatus mainly tests a characteristic of the diode element 6a of the DUT 6. In this case, the test apparatus may drive the switching element 2a during off states of the switching elements 6b and 13b, and the third switch 14, and may control the second switch 4 in a same manner as the first embodiment.

Suppose that the test apparatus mainly tests a characteristic of the switching element 6b of the DUT 6. In this case, the test apparatus may drive the switching element 6b of the DUT 6 during on states of the switching element 13b and the third switch 14 and off states of the switching element 2a and the second switch 4.

In the present embodiment, the DUT 6 is configured by the diode element 6a and the switching element 6b. In this case, in the characteristic test of the diode element 6a, the second switch 4 is controlled similar to the first embodiment. The configuration can provide advantages similar to the advantages provided by the first embodiment.

In the present embodiment, a single test apparatus can perform both an AC (Alternating Current) test of the diode element 6a and an AC test of the switching element 6b.

Other Embodiments

The first rectifying element 8 is provided by the Zener diode element in order to switch the path of the flyback current favorably by switching on and off the second switch 4. Alternatively, the first rectifying element 8 may be provided by the normal FWD element.

In the above-described first to third embodiment, the test apparatus may not have the protection switch 5. In the above-described third embodiment and fourth embodiment, the position of DUT 6 may be exchanged with the position of the protect element 13.

Each of the switching elements 2a, 6b, and 13b, the second switch 4, and the third switch 14 may be provided by a switching element except for the IGBT element, such as a MOS element.

The present disclosure can be applied to a DUT different from the DUT 6 provided by the FWD element in the above embodiments. For example, the present disclosure may be applied to a DUT having a FWD function and provided by a MOSFET element or the like. The different DUT includes a diode element.

In the above-described fourth embodiment, the first switch 2, the DUT 6, and the protect element 13 may be configured by a single chip in which the IGBT element is integrated with the FWD element.

Suppose that a voltmeter that measures the voltage Vka applied to the both end of the diode element 6a is disposed. In this case, the voltmeter and the controller 11 are employed as the breakdown detector so that the breakdown of the DUT 6 may be determined in case that the voltage Vka becomes approximately zero. In this case, the breakdown of the DUT 6 may be detected by employing a method disclosed in JP 2007-33042 A.

While the disclosure has been described with reference to preferred embodiments thereof, it is to be understood that the disclosure is not limited to the preferred embodiments and constructions. The disclosure is intended to cover various modification and equivalent arrangements. In addition, the various combinations and configurations, which are preferred, other combinations and configurations, including more, less or only a single device, are also within the spirit and scope of the disclosure.

The invention claimed is:

1. A semiconductor element test apparatus comprising:
   a first switch having a switching element;
   a coil;
   a second switch, wherein the first switch, the coil, and the second switch are connected in series to a power source;
   a semiconductor element provided as a test object, wherein the semiconductor element is disposed to configure a loop path along with the coil and the second switch when the switching element of the first switch is switched off, the semiconductor element has a diode element, and a cathode electrode of the diode element is connected to a positive electrode of the power source;
   a first rectifying element; and
   a second rectifying element connected to the first rectifying element in series, the second rectifying element having a rectification direction opposite to a rectification direction of the first rectifying element,
   wherein the first rectifying element and the second rectifying element configure, along with the coil, another loop path which is different from the loop path including the semiconductor element.

2. The semiconductor element test apparatus according to claim 1, further comprising
   a controller controlling the first switch and the second switch,
   wherein
   the controller switches on the first switch and switches off the first switch alternatively twice,
   the controller switches on the second switch at a time point after a first time switch-on of the first switch and before a second time switch-on of the first switch, and
   the controller switches off the second switch at a time point after the second time switch-on of the first switch and before a second time switch-off of the first switch.

3. The semiconductor element test apparatus according to claim 2, wherein
   a recovery operation of the diode element finishes after the second time switch-on of the first switch, and
   the controller switches off the second switch after the recovery operation of the diode element is finished and before the second time switch-off of the first switch.

4. The semiconductor element test apparatus according to claim 2, further comprising
   a breakdown detector detecting a breakdown of the semiconductor element,
   wherein, only when the breakdown detector detects the breakdown of the semiconductor element, the controller switches off the second switch at a time point after the second time switch-on of the first switch and before the second time switch-off of the first switch.

5. The semiconductor element test apparatus according to claim 4, wherein
   the breakdown detector detects the breakdown of the semiconductor element by setting a predetermined value of a backward current flowing through the semiconductor element as a threshold value, and the threshold value is set to a value higher than a peak value of the backward current in case that the semiconductor element is properly operating without a breakdown.

6. The semiconductor element test apparatus according to claim 4, further comprising
a protection switch connected in series to the power source,
wherein
the controller switches on the protection switch before a first time switch-off of the first switch, and switches off the protection switch when the breakdown of the semiconductor element is detected by the breakdown detector, and
the second switch is switched off after the breakdown of the semiconductor element is detected and before a switch-off of the protection switch.

7. The semiconductor element test apparatus according to claim 1, further comprising
a protect element,
wherein
the protect element is disposed to configure the loop path along with the semiconductor element, the coil, and the second switch when the switching element of the first switch is switched off,
the protect element has a rectification direction same as a rectification direction of the diode element, and
the protect element has a protect diode element having a larger breakdown strength than a breakdown strength of the semiconductor element.

8. The semiconductor element test apparatus according to claim 1, wherein
the first rectifying element is provided by a Zener diode,
the first rectifying element is connected to have the rectification direction opposite to a flowing direction of a current generated by a counter electromotive force of the coil, and
the counter electromotive force of the coil is generated when the second switch is switched off.

9. The semiconductor element test apparatus according to claim 8, wherein
a reverse breakdown voltage of the first rectifying element is higher than a sum of a maximum value of a forward voltage applied to the diode element when a flyback current flows through the diode element and a switch-on voltage of the second switch.

10. The semiconductor element test apparatus according to claim 7, wherein
the first rectifying element is provided by a Zener diode,
the first rectifying element is connected to have the rectification direction opposite to a flowing direction of a current generated by a counter electromotive force of the coil,
the counter electromotive force of the coil is generated when the second switch is switched off, and
a reverse breakdown voltage of the first rectifying element is higher than a sum of a maximum value of a forward voltage applied to the diode element when a flyback current flows through the diode element, a maximum value of a forward voltage applied to the protect diode element when the flyback current flows through the protect diode element, and a switch-on voltage of the second switch.

11. The semiconductor element test apparatus according to claim 8, wherein
a reverse breakdown voltage of the first rectifying element is lower than a voltage obtained by subtracting a voltage of the power source from an avalanche breakdown tolerance of the second switch.

12. A semiconductor element test method for a semiconductor element, wherein the semiconductor element has a diode element which is provided as a test object,
the semiconductor element test method comprising:
connecting a first switch, a coil, and a second switch in series to a power source, wherein the first switch has a switching element;
disposing the semiconductor element to configure a loop path along with the coil and the second switch when the switching element of the first switch is switched off;
connecting a cathode electrode of the diode element to a positive electrode of the power source;
disposing a first rectifying element and a second rectifying element to configure, along with the coil, another loop path which is different from the loop path including the semiconductor element, wherein the second rectifying element is connected to the first rectifying element in series, and the second rectifying element has a rectification direction opposite to a rectification direction of the first rectifying element; and
performing a test of the semiconductor element by switching on and switching off the switching element repeatedly.

13. The semiconductor element test method according to claim 12, wherein
the first switch is switched on and switched off alternatively twice,
the second switch is switched on at a time point after a first time switch-on of the first switch and before a second time switch-on of the first switch, and
the second switch is switched off at a time point after the second time switch-on of the first switch and before a second time switch-off of the first switch.

14. The semiconductor element test method according to claim 13, wherein
a recovery operation of the diode element finishes after the second time switch-on of the first switch, and
the second switch is switched off after the recovery operation of the diode element is finished and before the second time switch-off of the first switch.

* * * * *